US 6,737,285 B2

(12) United States Patent
Iketani et al.

(10) Patent No.: US 6,737,285 B2
(45) Date of Patent: *May 18, 2004

(54) SEMICONDUCTOR DEVICE MANUFACTURING METHOD (75) Inventors: Koji Iketani, Gunma (JP); Takayuki Tani, Gunma (JP); Takao Shibuya, Gunma (JP); Haruo Hyodo, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/900,093

(22) Filed: Jul. 6, 2001

(65) Prior Publication Data

US 2002/0004250 A1 Jan. 10, 2002

(30) Foreign Application Priority Data

Jul. 7, 2000 (JP) .................... P. 2000-206305

(51) Int. Cl.[7] .................... G01R 31/76; H01L 21/66
(52) U.S. Cl. .................... 438/15; 438/118
(58) Field of Search .................... 438/14, 15, 106, 438/114, 118, 127, FOR 101; 257/787; 156/226.1, 264

(56) References Cited

U.S. PATENT DOCUMENTS

| 5,814,894 | A | | 9/1998 | Igarashi et al. ............. 257/787 |
|---|---|---|---|---|
| 5,896,036 | A | * | 4/1999 | Wood et al. ................ 324/755 |
| 6,048,750 | A | * | 4/2000 | Hembree .................... 438/107 |
| 6,080,602 | A | * | 6/2000 | Tani et al. .................. 438/110 |
| 6,113,728 | A | | 9/2000 | Tsukagoshi et al. ........ 156/264 |
| 6,211,960 | B1 | * | 4/2001 | Hembree .................... 356/400 |
| 6,215,194 | B1 | * | 4/2001 | Nakabayashi ............... 257/620 |
| 6,309,911 | B2 | * | 10/2001 | Hyoudo et al. ............. 438/106 |
| 6,368,893 | B1 | * | 4/2002 | Tani et al. .................. 438/106 |
| 6,495,379 | B2 | * | 12/2002 | Iketani ....................... 438/15 |
| 6,528,330 | B2 | | 3/2003 | Iketani ....................... 438/14 |

FOREIGN PATENT DOCUMENTS

JP  H05-129473  5/1993

* cited by examiner

Primary Examiner—George Fourson
Assistant Examiner—Fernando Toledo
(74) Attorney, Agent, or Firm—Fish & Richardson P.C.

(57) ABSTRACT

The present invention provides a method for manufacturing a semiconductor device comprising steps of: bonding one semiconductor chip to each of multiple mounting portions of a substrate; covering the semiconductor chips bonded to the mounting portions with a common resin layer; bringing the substrate into contact with the resin layer and gluing the substrate to an adhesive sheet; and performing dicing and measurement for the semiconductor chips that are glued to the adhesive sheet.

6 Claims, 12 Drawing Sheets

SEMICONDUCTOR DEVICE MANUFACTURING METHOD

BACKGROUND OF THE INVENTION

The present invention relates to a method for manufacturing a semiconductor device, and relates in particular to a method for manufacturing a semiconductor device whereby a smaller mounting area can be provided by reducing the external size of a package without using lead forming, and a considerable reduction in manufacturing costs can be realized.

In a process for the manufacture of semiconductor devices, multiple semiconductor chips, produced from a single wafer by dicing, are securely mounted in a lead frame, after which transfer molding, using a die and resin injection, is used to seal them. The thus sealed semiconductor chips are then separated to provide multiple individual semiconductor devices. For this process, either a strip-shaped or a hoop-shaped lead frame is employed, but regardless of which type of lead frame is used, only a single sealing procedure is required to simultaneously seal a plurality of semiconductor devices.

Figure 12:
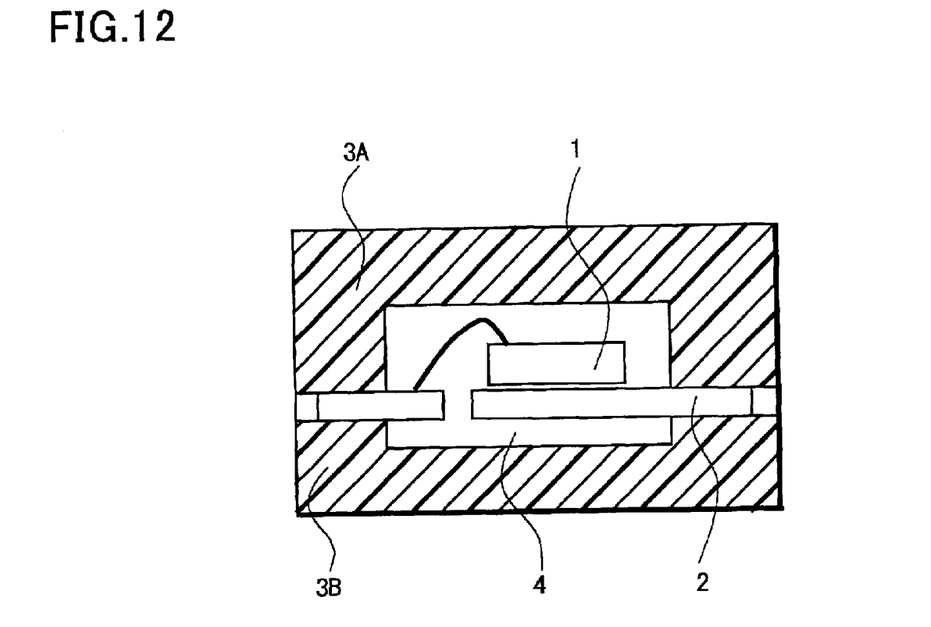
FIG. 12 is a cross-sectional view for explaining a conventional example.

FIG. 12 is a diagram showing a transfer molding process. During this process, the semiconductor chip 1 fixed to a die pad of a lead frame 2 by die bonding or wire bonding is mounted inside a cavity 4, formed of an upper and a lower die 3A and 3B, and an epoxy resin is injected into the cavity 4 to seal the semiconductor chip 1. Once the process has been completed, the lead frame 2 is cut to complete the fabrication of a separate semiconductor device (e.g., Japanese Patent Publication No. H05-129473).

Figure 13:
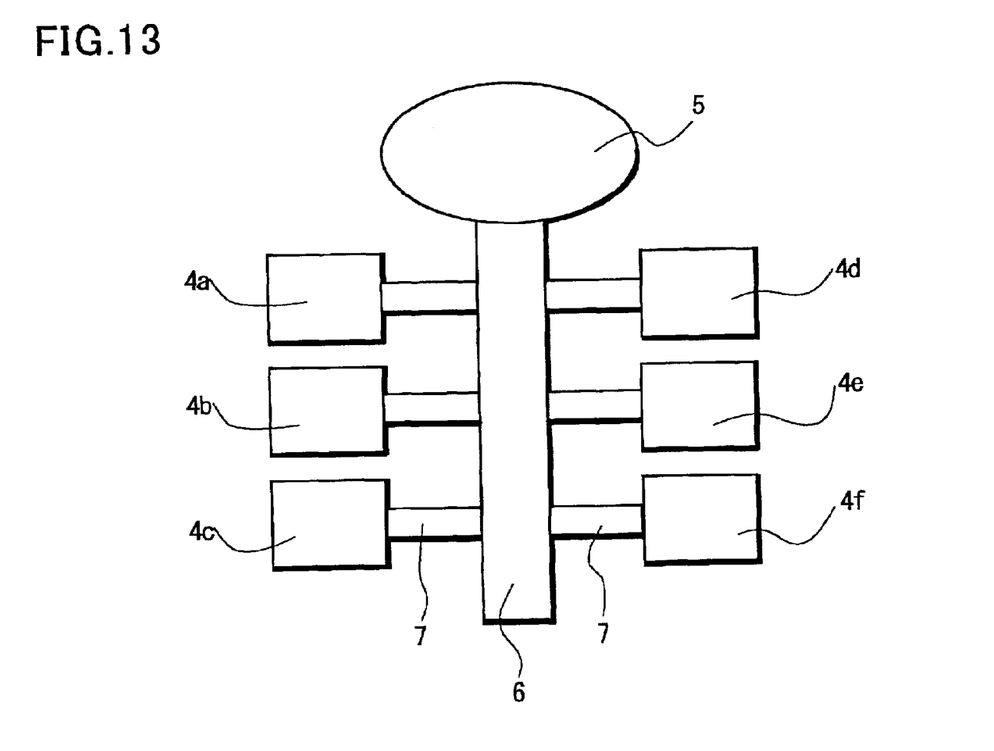
FIG. 13 is a plan view for explaining the conventional example.

For this process, as is shown in FIG. 13, multiple cavities 4a to 4f, a resin source 5 for injecting a resin, a runner 6, and gates 7 for injecting the resin into the cavities 4a to 4f via the runner 6, are formed in the surface of the die 3B. For example, if ten semiconductor chips 1 are mounted on a single lead frame, ten cavities 4, ten gates 7 and one runner 6 are formed for one lead frame. And the cavities 4 equivalent to, for example, twenty lead frames are formed in the inner surfaces of the die 3.

Figure 14:
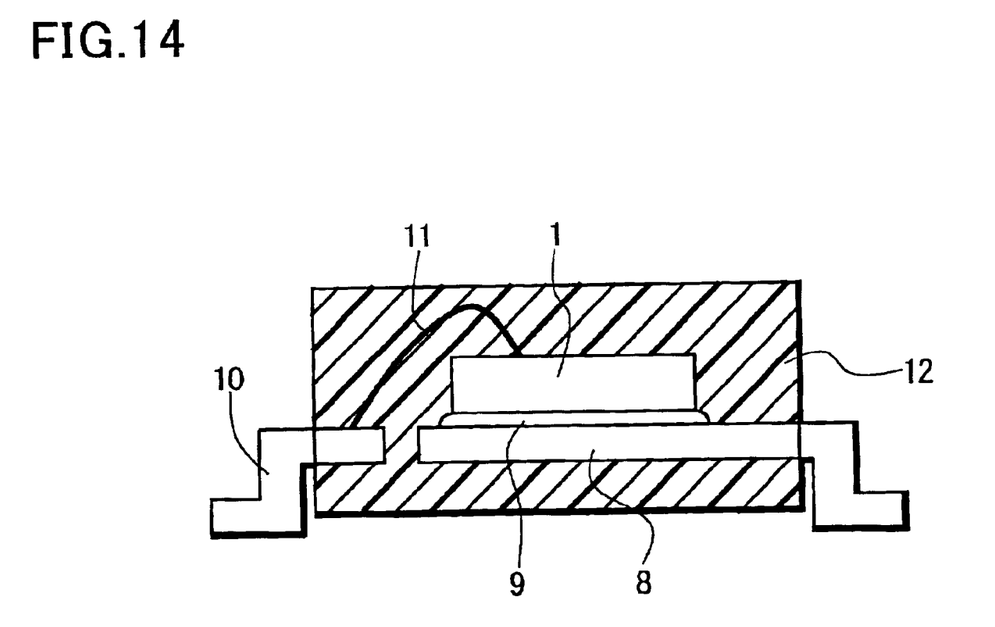
FIG. 14 is a cross-sectional view for explaining the conventional example.

FIG. 14 is a diagram showing a semiconductor device obtained by transfer molding. The semiconductor chip 1 whereon elements, such as transistors, are formed is securely attached to an island 8 of the lead frame by a brazing material 9, such as solder; the electrode pad of the semiconductor chip 1 is connected to a lead terminal 10 by a wire 11; the periphery of the semiconductor chip 1 is covered with a resin 12 that conforms to the shapes of the cavities 4; and the distal end of the lead terminal 10 is extended outside the resin 12.

Since, in a conventional package, the lead terminal 10 for an external connection is exposed, outside the resin 12, the distance up to the tip end of the lead terminal 10 must be considered as being part of the mounting area, and thus, the mounting area is much larger than the external dimensions of the resin 12.

Further, since according to the conventional transfer molding technique the resin is hardened under pressure, even the resin in the runner 6 and the gates 7 is hardened, and the residual resin therein must be disposed of. Thus, according to the method using the above lead frame whereby the gates 7 are provided for the individual semiconductor devices that are to be manufactured, efficiency in the use of the resin is low, and relative to the amount of resin employed, only a small number of semiconductor devices can be manufactured.

Further, since, after a transfer molding process a lead frame is separated into tiny packages comprising individual semiconductor devices, it is extremely difficult to handle the obtained semiconductor devices when they must be measured or stored in tape because it is difficult to determine which are their obverse and which are their reverse sides, and because of how the lead terminals are positioned. As a result, work efficiency is adversely affected and greatly deteriorated.

SUMMARY OF THE INVENTION

To achieve the shortcomings, according to the invention, a method for manufacturing a semiconductor device comprises the steps of:

bonding one semiconductor chip to each of multiple mounting portions of a substrate;

covering the semiconductor chips bonded to the mounting portions with a common resin layer;

bringing the substrate into contact with the resin layer and gluing the substrate to a adhesive sheet;

performing dicing and measurement for the semiconductor chips that are glued to the adhesive sheet. Thus, the semiconductor chips that are integrally supported by the adhesive sheet can be measured, without the having to be separated into individual semiconductor devices.

Further, according to the invention, a method for manufacturing a semiconductor device comprises the steps of:

bonding a semiconductor chip to each of multiple mounting portions of a substrate;

covering the semiconductor chips bonded to the mounting portions with a common resin layer;

bringing the substrate into contact with the resin layer and gluing the substrate to an adhesive sheet;

dicing and measuring the semiconductor chips while the substrate is glued to the adhesive sheet; and storing directly in a carrier tape semiconductor devices glued to the adhesive sheet. Thus, the semiconductor chips can be processed while integrally supported by the adhesive sheet, and need not be separated into individual semiconductor devices until they are stored in a carrier tape.

DETAILED DESCRIPTION OF THE PREFERRED EMBODIMENT

The preferred embodiment of the invention will now be described in detail.

Figure 1:
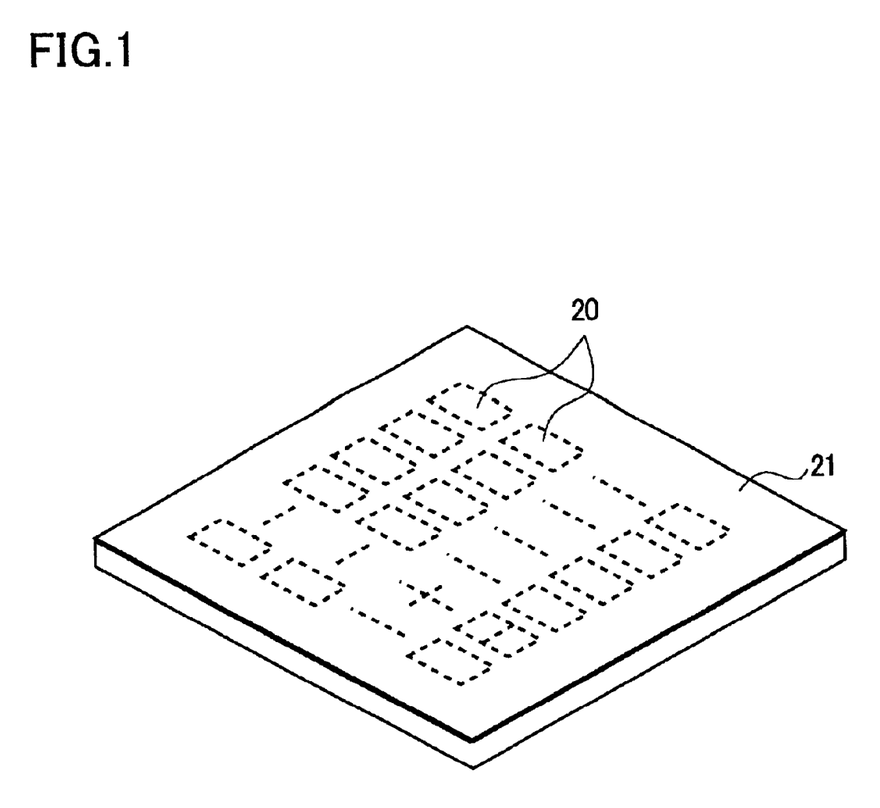
FIG. 1 is a perspective view for explaining a manufacturing method of the invention.
Figure 2A:
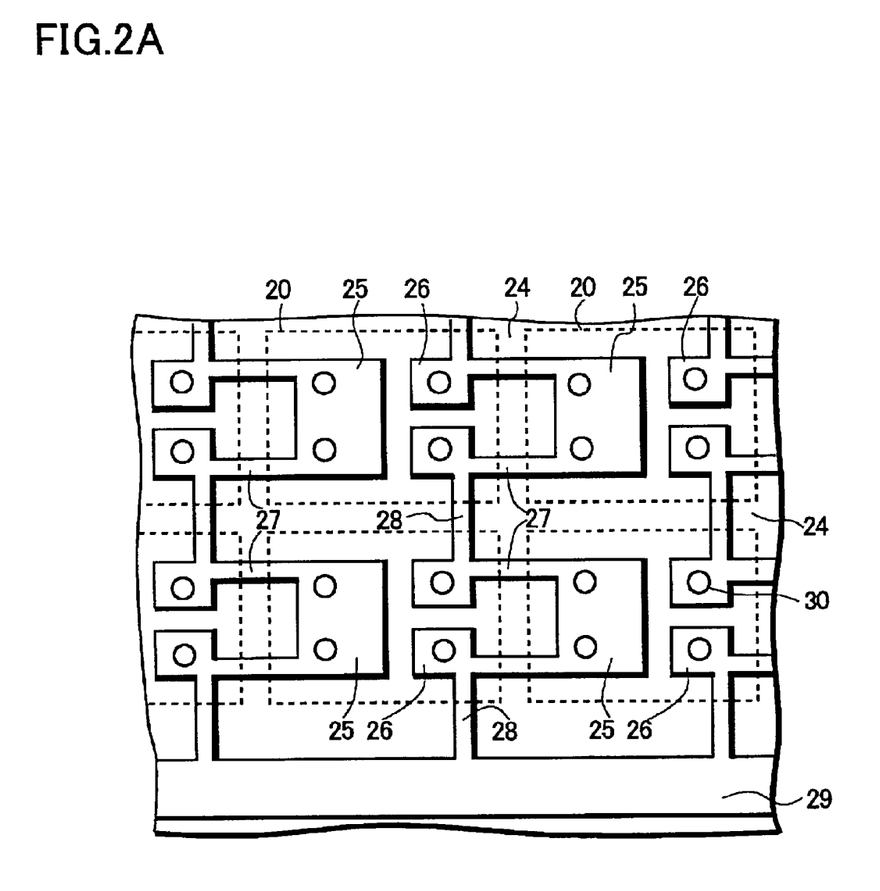
FIG. 2A is a plan view for explaining the manufacturing method of the invention and FIG. 2B is a cross-sectional view for explaining the manufacturing method of the invention.
Figure 2B:
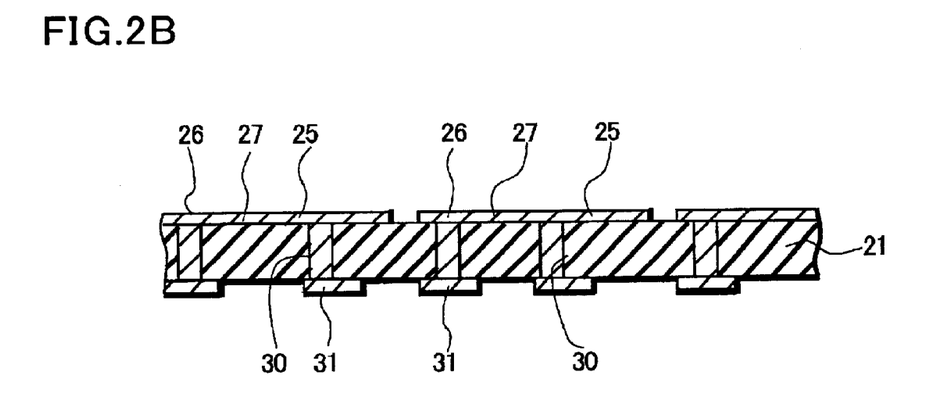
Figure 3:
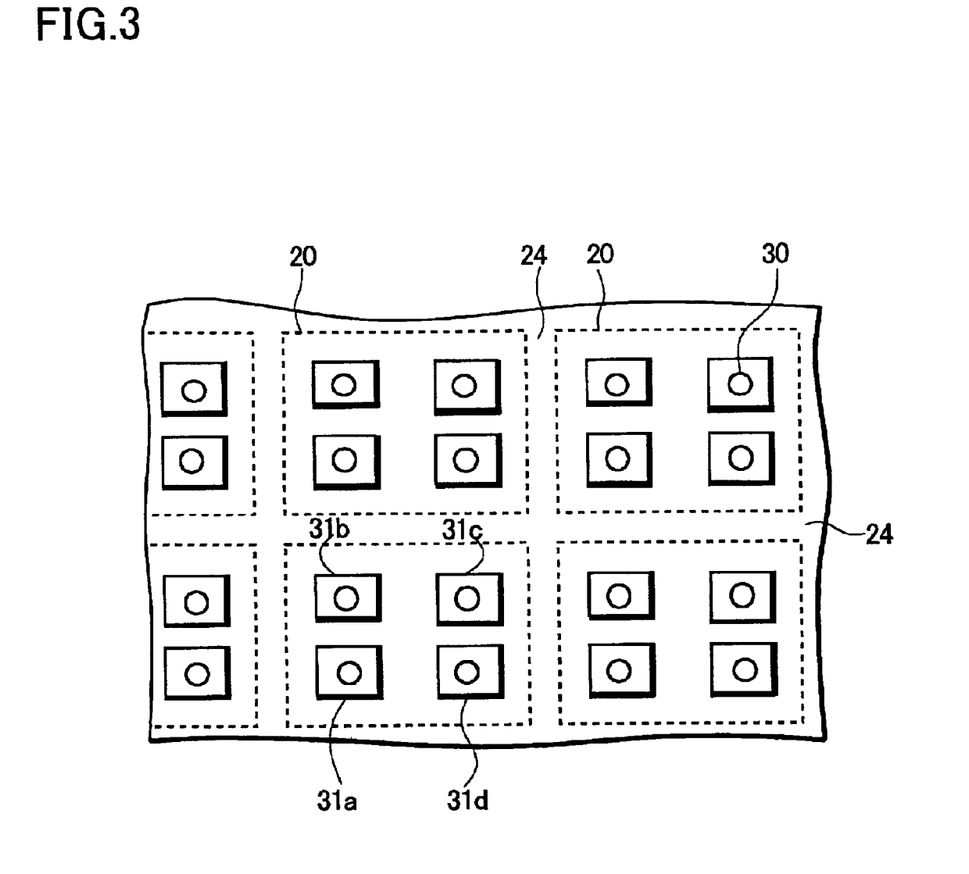
FIG. 3 is a plan view for explaining the manufacturing method of the invention.

A first step for this invention is the preparation of a substrate having multiple mounting portions, as is shown in FIGS. 1 to 3.

First, as is shown in FIG. 1, a large substrate 21 is prepared whereon positions are laid out for multiple mounting portions 20 for corresponding semiconductor devices, so as to provide, for example, a 100-mounting portion 20 arrangement of 10 rows and 10 columns. The substrate 21 is a single or a multilayered glass epoxy or ceramic substrate having a total 200 to 350 [$\mu$m] thickness that will provide adequate mechanical strength during the manufacturing process.

On the obverse surface of each mounting portion 20 on the substrate 21, a metal paste, such as tungsten, is printed on the obverse surface of each mounting portion 20 and a conductive pattern is formed by means of electrolytic-plating with gold. In addition, as an external connection electrode, an electrode pattern is formed on the reverse surface of the substrate 21.

FIG. 2A is a plan view of a conductive pattern formed on the surface of the substrate 21, and FIG. 2B is a cross-sectional view of the substrate 21.

The mounting portions 20 enclosed with broken lines are shaped like rectangles having, for example, long sides of 1.0 mm and short sides of 0.8 mm, and are arranged vertically and horizontally at intervals of 20 to 25 [$\mu$m]. These intervals are used as dicing lines 24 for the following step. As the conductive patterns, island portions 25 and lead portions 26 are formed in each mounting portion 20, and have the same shape in all mounting portions 20. The island portions 25 are where the semiconductor chips are mounted, and the lead portions 26 are the portions that are connected by wires to the electrode pads on the semiconductor chips. Two first connecting portions 27 are extended from each island portion 25 to the lead portions 26 of adjacent mounting portion 20 with a continued pattern, and passing over dicing lines 24 on the way. The line width of the first connecting portions 27 is narrower than the island portion 25, e.g., 0.1 [mm]. In addition, second connecting portions 28, which also pass over dicing lines 24 but in a direction that is perpendicular to that of the first connecting portions 27, are extended from lead portions 26 to the lead portions 26 of adjacent mounting portions 20 or to a common connecting portion 29 that encloses the entire group of mounting portions 20. Since the first and the second connecting portions 27 and 28 are extended as they are, the island portions 25 and the lead portions 26 of all the mounting portions 20 are connected electrically. This arrangement is used because of the common electrodes that are prepared to perform electrolytic plating with gold or the like.

In FIG. 2B, a through hole 30 is formed in each mounting portion 20 on the insulating substrate 21 and is filled with a conductive material, such as tungsten. And for each through hole 30, a corresponding external electrode 31 is formed on the reverse surface.

FIG. 3 is a plan view of the pattern of external electrodes 31a to 31d, viewed from the reverse surface of the substrate 21. The external electrodes 31a, 31b, 31c and 31d are provided 0.05 to 0.1 [mm] away from the ends of the mounting portions 20. Although an individual pattern is provided for the external electrodes 31, they are all connected to the common connecting portion 29 via the through holes 30. Thus, a gold-plated layer can be formed on all the conductive patterns by an electrolytic plating method for which the conductive pattern on the opposite side is employed as an electrode. Further, only the first and second connecting portions 27 and 28, which have narrow line widths, pass across the dicing lines 24.

Figure 4:
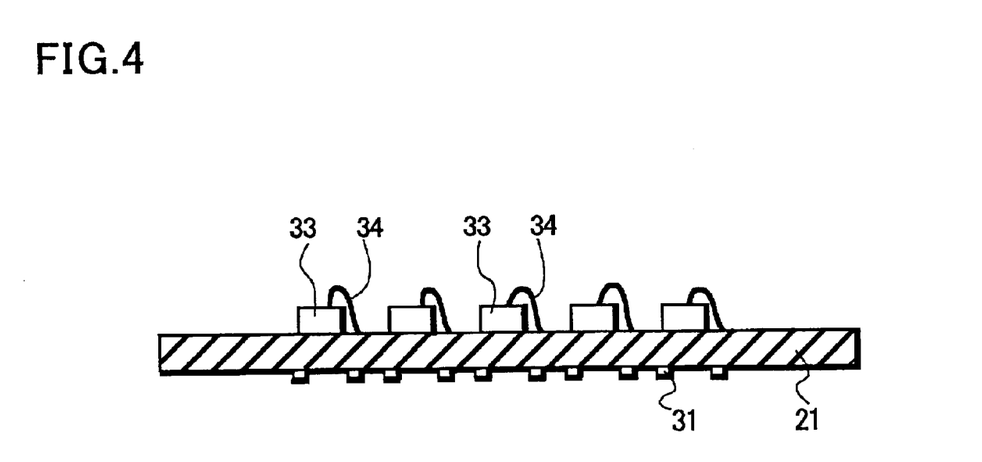
FIG. 4 is a cross-sectional view for explaining the manufacturing method of the invention.

A second step of the invention is to fix a semiconductor chip to each of the mounting portions 20 by wire bonding, as is shown in FIG. 4.

A semiconductor chip 33 is attached by die bonding and wire bonding to each mounting portion 20 of the substrate 21 on which a gold-plated layer is formed. A semiconductor 33 is fixed to the surface of an island portion 25 using an adhesive, such as a Ag paste, and the electrode pad of the semiconductor chip 33 is connected to lead portions by wires 34. As the semiconductor chips 33, active devices are formed that have three terminals, a bipolar transistor and a power MOSFET. When the bipolar devices are mounted, the external electrodes 31a and 31b, which are connected to the island portions 25, act as collector terminals, and the external electrodes 31c and 31d, which are connected to the lead portions 26 act as base-emitter electrodes.

Figure 5A:
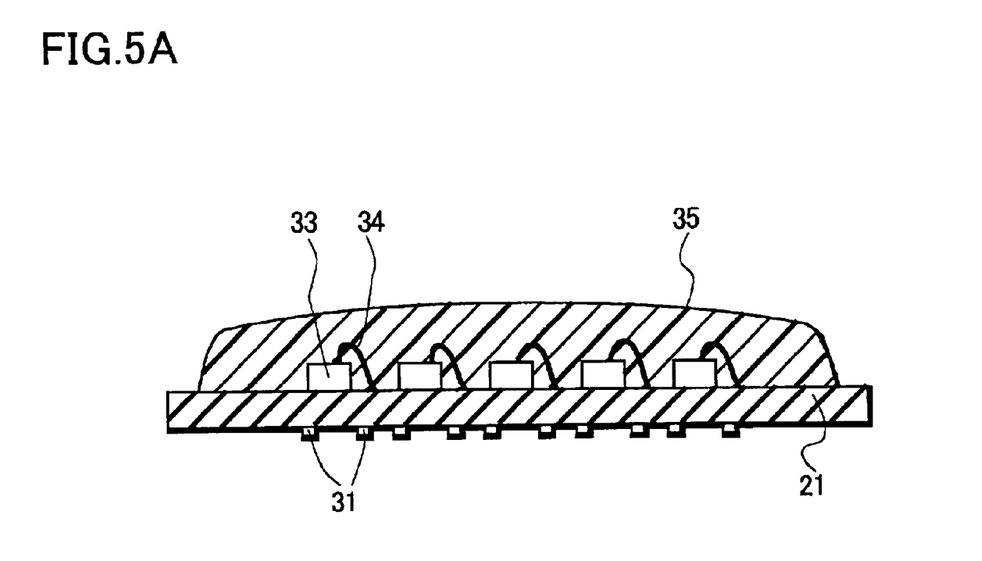
FIG. 5A is a cross-sectional view for explaining the manufacturing method of the invention and FIG. 5B is a cross-sectional view for explaining the manufacturing method of the invention.
Figure 5B:
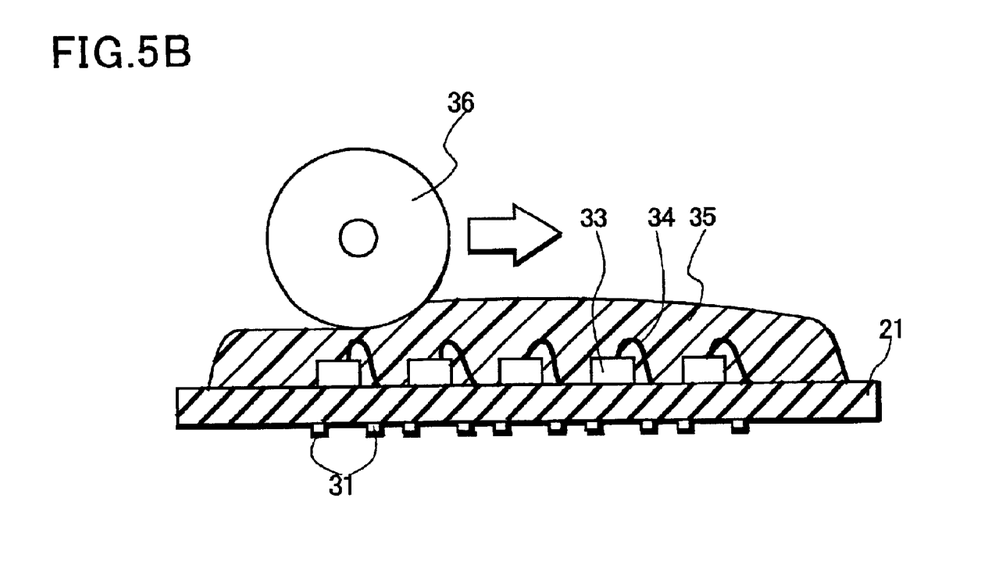

A third step of the invention is to cover the substrate 21 with a resin and to cover, with a common resin layer, the individual semiconductor chips bonded to the mounting portions, as is shown in FIGS. 5A and 5B.

As is shown in FIG. 5A, a predetermined amount of epoxy resin liquid is dropped (potting) from a dispenser (not shown) that is conveyed above the substrate 21, and all the semiconductor chips 33 are covered with a common resin layer 35. When, for example, 100 semiconductor chips 33 are mounted on one substrate 21, all 100 semiconductor chips 33 are collectively covered. For this, CV576AN (Matsushita Electric Works, Ltd.) is employed as the liquid resin. And since the dropped resin liquid is comparatively viscous and has a high surface tension, a curved resin surface is formed.

Following this, as is shown in FIG. 5B, the deposited resin layer 35 is set by employing a thermal process (curing process) for several hours at a temperature of 100 to 200° C., and the surface of the resin layer 35 is then flattened by grinding the curved surface. A dicing machine is employed for the grinding, and a dicing blade 36 is used to grind the surface of the resin layer 35 and provide a surface that is aligned, at a constant height, with the substrate 21. At this step, the height of the resin layer 35 is reduced until it has a thickness of from 0.3 to 1.0 [mm], and the resulting flat surface extends from end to end of the resin layer 35, so that even when the outermost semiconductor chips 33 are separated to obtain individual semiconductor devices, resin packages having a standard external size can be formed. For this process, dicing blades 36 of various thicknesses are prepared, and when the grinding is repeated multiple times using a comparatively thick dicing blade 36, an overall flat structure is formed.

The surface of the resin layer 35 may also be flattened by pressing a flat formation member against the surface of the deposited resin layer 35 before it has fully hardened.

Figure 6A:
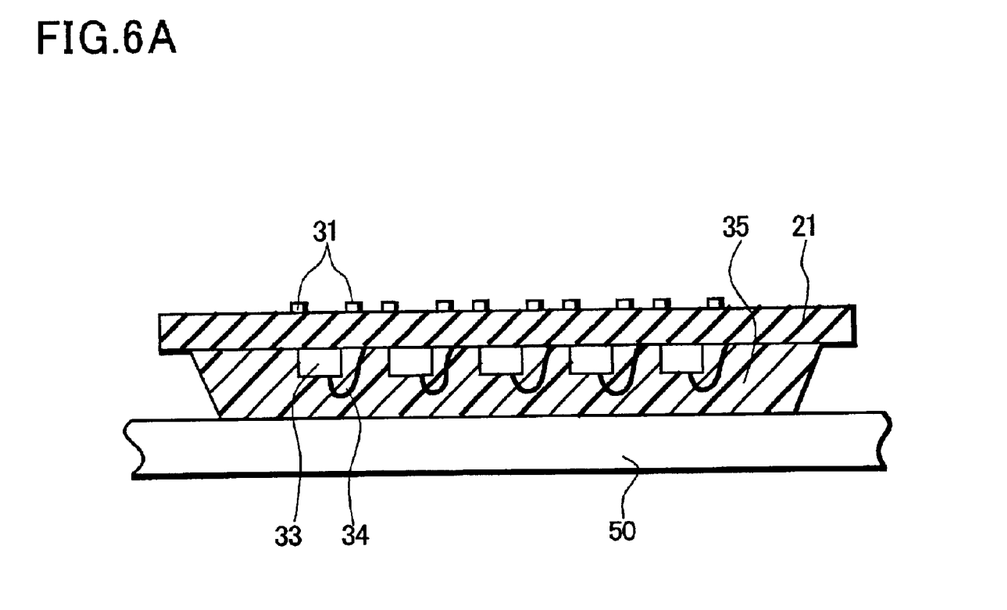
FIG. 6A is a cross-sectional view for explaining the manufacturing method of the invention and FIG. 6B is a plan view for explaining the manufacturing method of the invention.
Figure 6B:
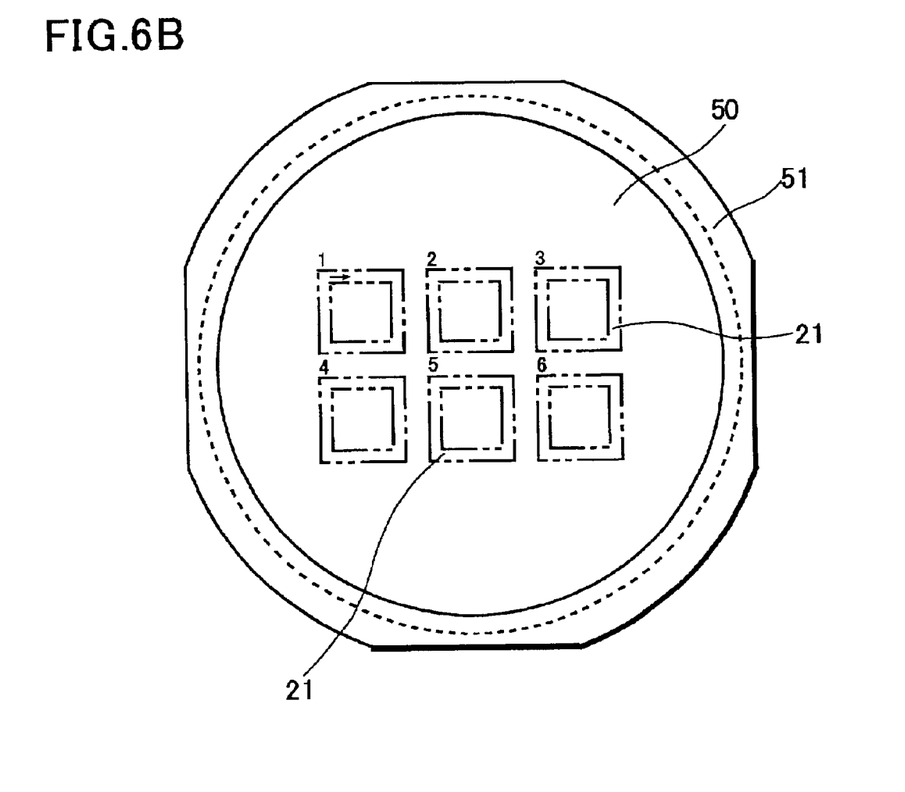

A fourth step of the invention is the gluing of a adhesive sheet 50 to the resin layer 35 covering the substrate 21, as is shown in FIGS. 6A and 6B.

As is shown in FIG. 6A, the substrate 21 is inverted, and the adhesive sheet (e.g., a UV sheet, the brand name of a Lintec Corporation product) is glued to the surface of the resin layer 35. Since as a result of the processing performed at the previous step the surface of the resin layer 35 is flat and is horizontal to the surface of the substrate 21, there is no tilting of the substrate 21, even when the adhesive sheet 50 is glued to the surface of the resin layer 35, and horizontal and vertical accuracy is maintained.

As is shown in FIG. 6B, the circumferential edge of the adhesive sheet 50 is glued to a ring-shaped stainless steel metal frame 51, and in its center, six substrates 21 are glued at regular intervals.

Figure 7A:
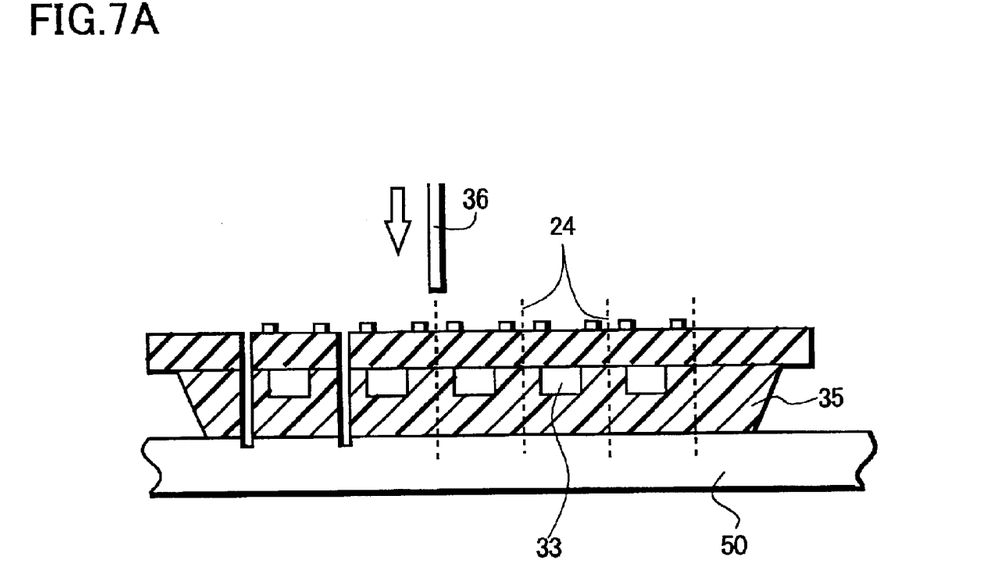
FIG. 7A is a cross-sectional view for explaining the manufacturing method of the invention and FIG. 7B is a plan view for explaining the manufacturing method of the invention.
Figure 7B:
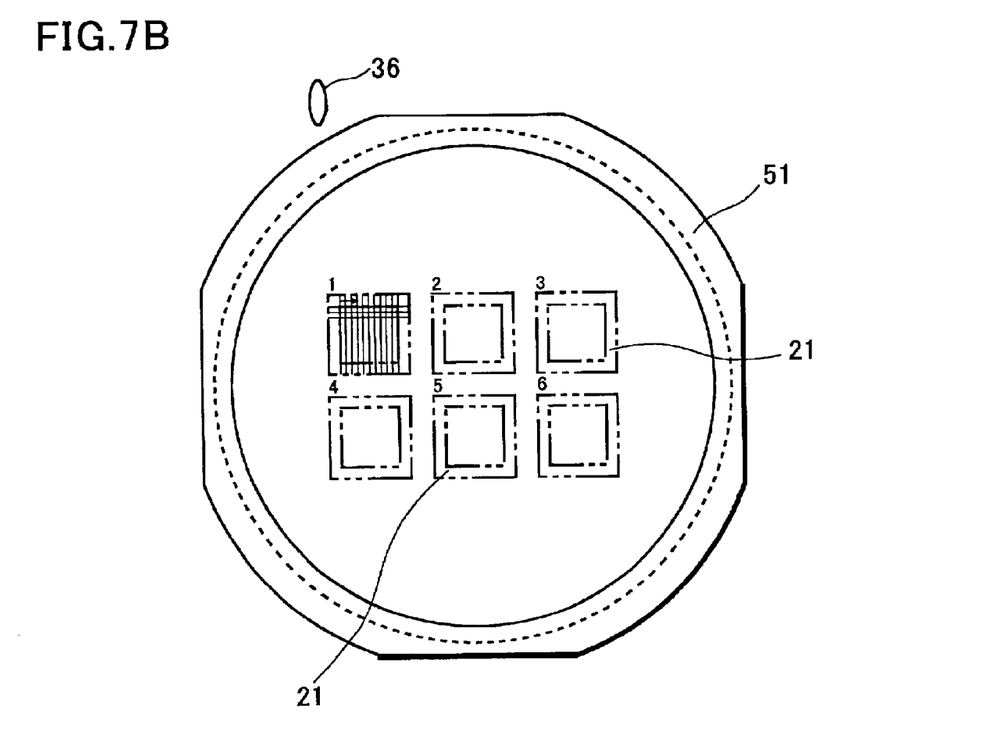

A fifth step of the invention, as is shown in FIGS. 7A and 7B, is the dicing of the substrate 21 and the resin layer 35, performed from the reverse side of the substrate 21, to cut out the mounting portions 20 and to thus obtain separate semiconductor devices.

As is shown in FIG. 7A, the substrate 21 and the resin layer 35 around each mounting portion 20 are cut, and separate semiconductor devices are obtained. The resin layer 35 and the substrate 21 are cut at the same time along the dicing lines 24 by the dicing blade 36 of the dicing machine, and separate semiconductor devices are obtained that correspond to the individual mounting portions 20. The cutting depth during the dicing process is such that the dicing blade 36 reaches and penetrates the surface of the adhesive sheet 50. At this time, an alignment mark (e.g., a through hole formed at the perimeter of the substrate 21 or in a portion of the gold-plated layer) that can be observed from the reverse side of the substrate 21 can be automatically identified by the dicing machine, and this alignment mark is used as a position reference while the dicing is being performed. Further, the pattern is so designed that the dicing blade 36 does not contact the conductive patterns 31a, 31b, 31c and 31d and the island portions 25. This is because, since the separation of the gold-plated layer is comparatively inferior, the occurrence of burrs at the gold-plated layer is prevented to the extent possible. Therefore, the dicing blade 36 contacts the gold-plated layer only at the first and the second connecting portions 27 and 28, which are used as electrical connections.

As is shown in FIG. 7B, multiple substrates 21 glued to the adhesive sheet 50, which around its circumference is glued to the metal frame 51, are separated by the dicing machine along the vertical dicing lines 24, which for each substrate 21 are individually identified. Then, the metal frame 51 is rotated 90 degrees, and the substrates 21 are separated along the horizontal dicing lines 24. The semiconductor devices obtained by the dicing continue to be supported on the adhesive sheet 50 by the viscous agent, and are not separated individually.

Figure 8A:
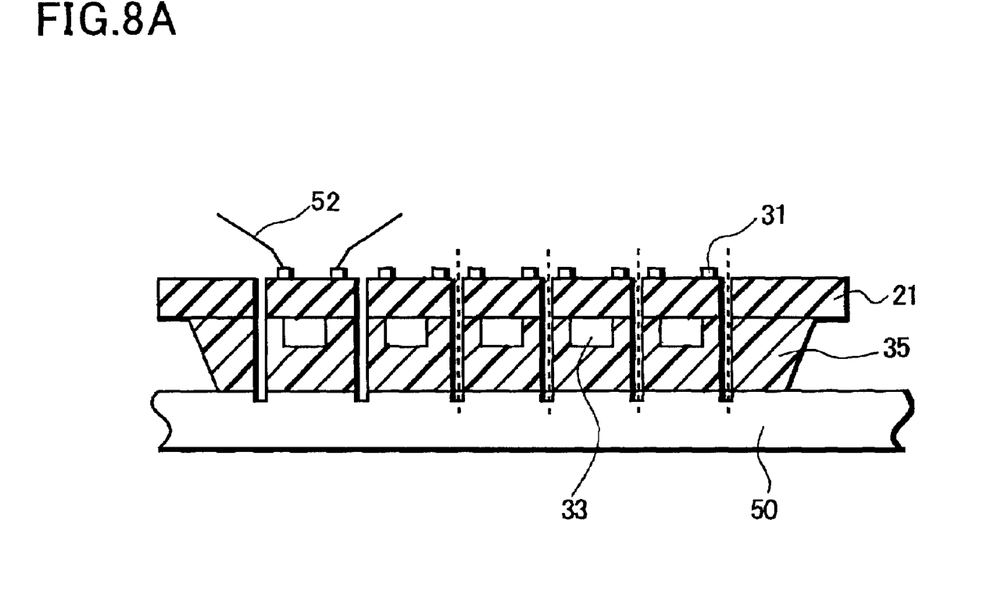
FIG. 8A is a cross-sectional view for explaining the manufacturing method of the invention and FIG. 8B is a plan view for explaining the manufacturing method of the invention.
Figure 8B:
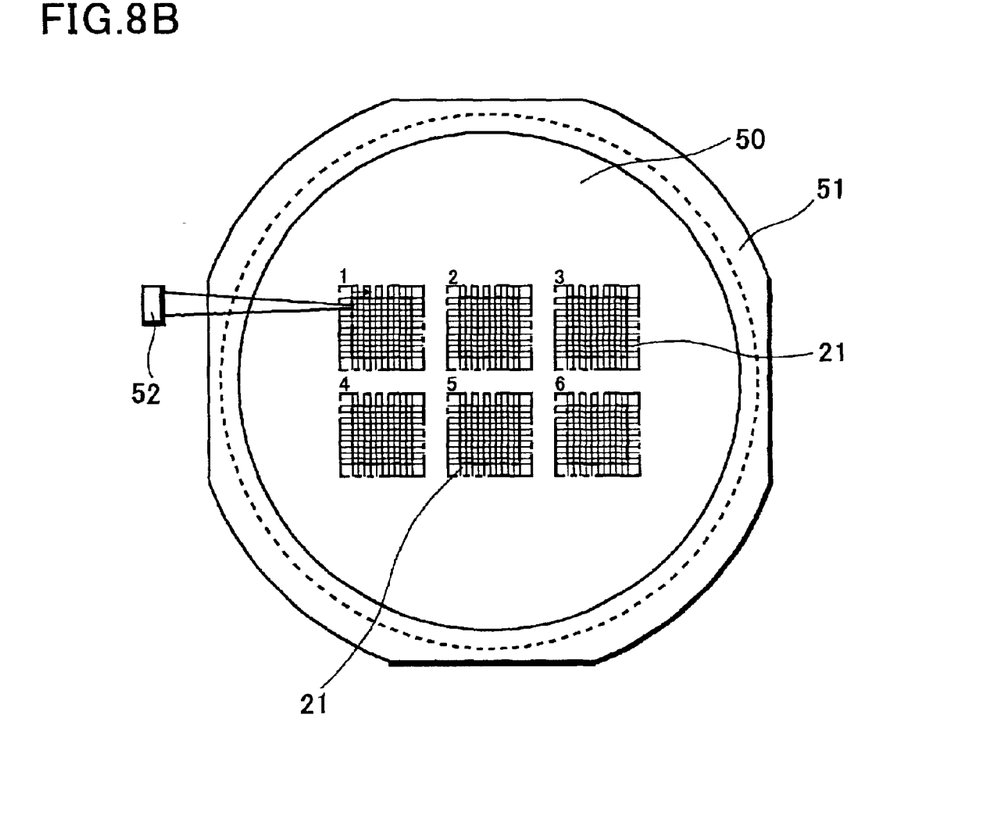

A sixth step of the invention, as is shown in FIGS. 8A and 8B, is the measurement of the characteristics of the semiconductor devices integrally supported by the adhesive sheet 50.

As is shown in FIG. 8A, a probe 52 is brought into contact with the external electrodes 31a to 31d that are exposed on the reverse surfaces of the substrates 21 of the semiconductor devices that are integrally supported by the adhesive sheet 50. And then the characteristic parameters of the individual semiconductor devices are measured to determine their qualities, and magnetic ink is used to mark defective devices.

As is shown in FIG. 8B, since multiple substrates 21 are supported by the metal frame 51 and the individual semiconductor devices are maintained in the state obtained at the dicing step, the metal frame 51 need only be moved vertically and horizontally a pitch equivalent to the size of one semiconductor device for an extremely large number of semiconductor devices to be easily measured. That is, a determination of the obverse and reverse sides of semiconductor devices, and a determination of the types, for example, of emitters, bases and collectors provided for external electrodes are not required.

Figure 9A:
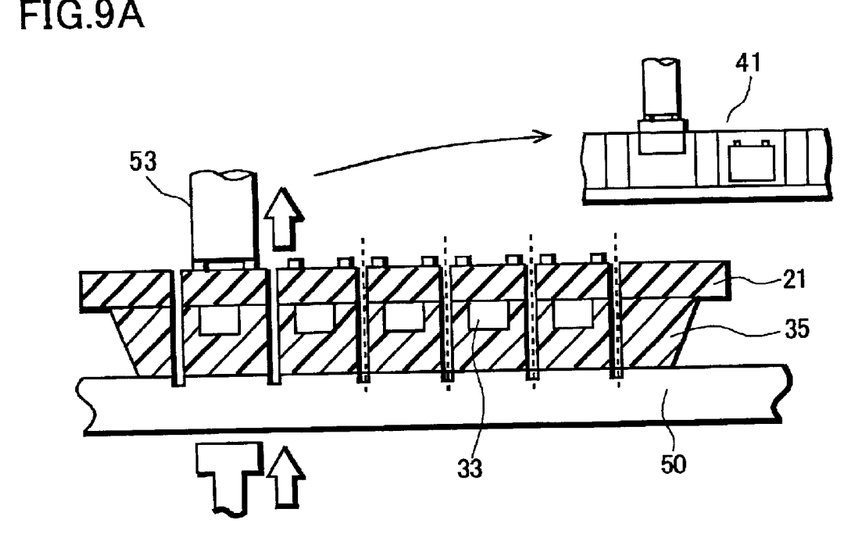
FIG. 9A is a cross-sectional view for explaining the manufacturing method of the invention.
Figure 9B:
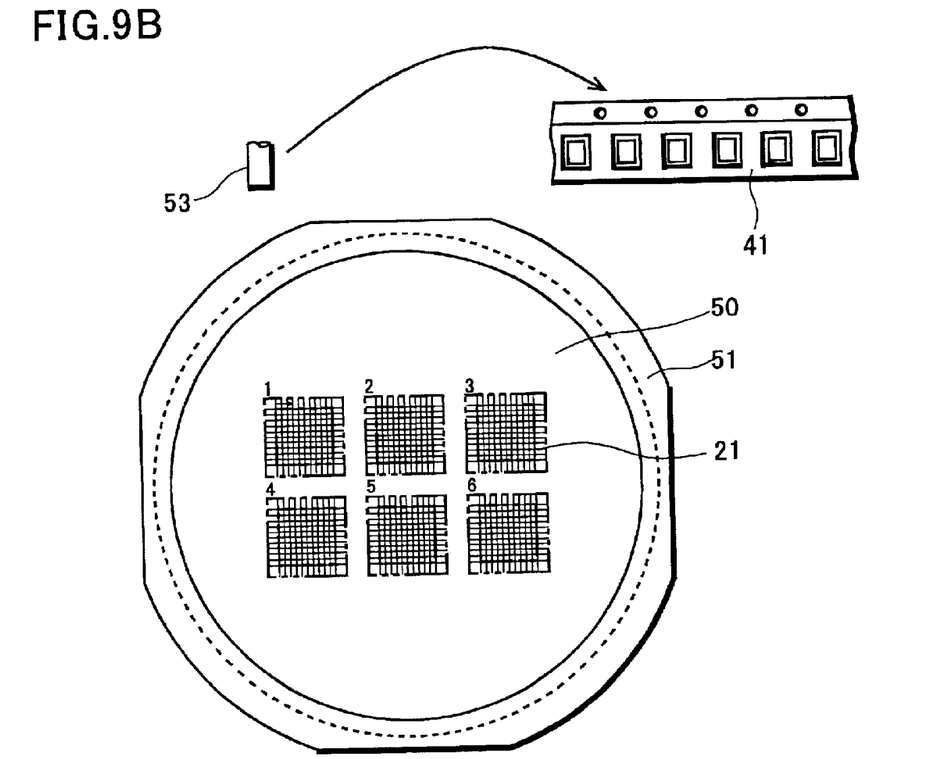
FIG. 9B is a plan view for explaining the manufacturing method of the invention.

A seventh step of the invention is, as is shown in FIGS. 9A and 9B, the direct storage in a carrier tape 41 of the semiconductor devices integrally supported by the adhesive sheet 50.

As is shown in FIG. 9A, after the measurements performed for the semiconductor devices integrally supported by the adhesive sheet 50, only those devices for which excellent results were obtained are peeled from the adhesive sheet 50 by a vacuum collet 53, and are deposited in storage holes in the carrier tape 41.

As is shown in FIG. 9B, since multiple substrates 21 are supported by the metal frame 51, and since individual semiconductor devices are maintained in the state obtained at the dicing step, the metal frame 51 need only be moved a pitch equivalent to the size of one semiconductor device to enable the extremely easy storage of a large number of semiconductor devices in the carrier tape 41.

Figure 10A:
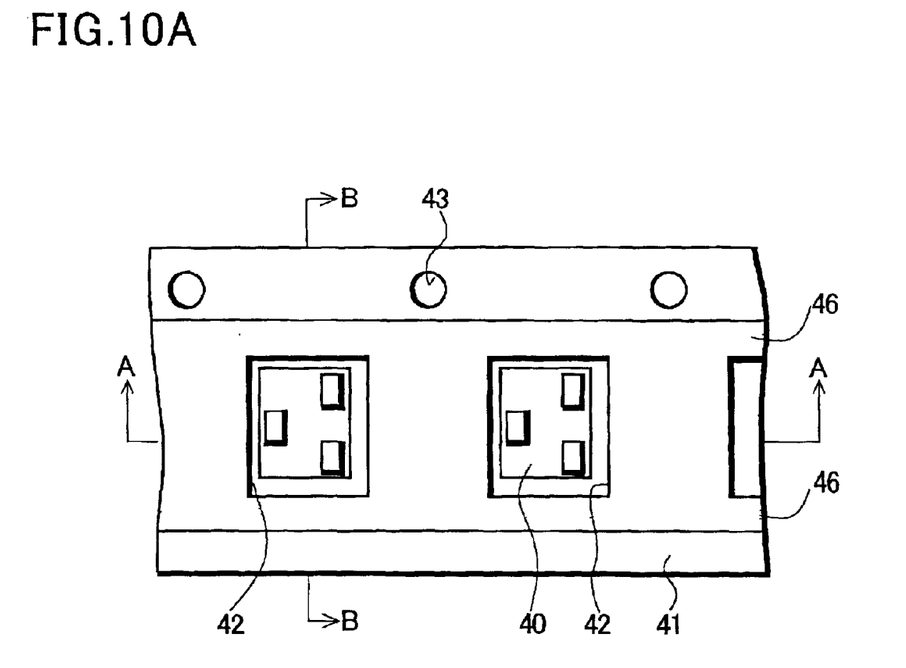
FIG. 10A is a plan view for explaining the manufacturing method of the invention.
Figure 10B:
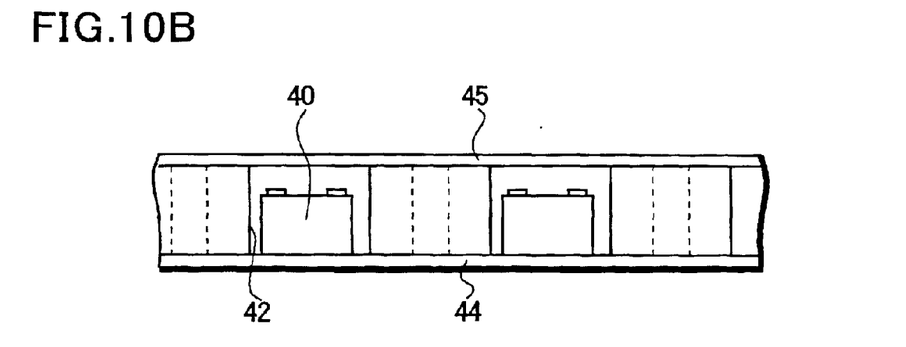
FIG. 10B is a cross-sectional view for explaining the manufacturing method of the invention.
Figure 10C:
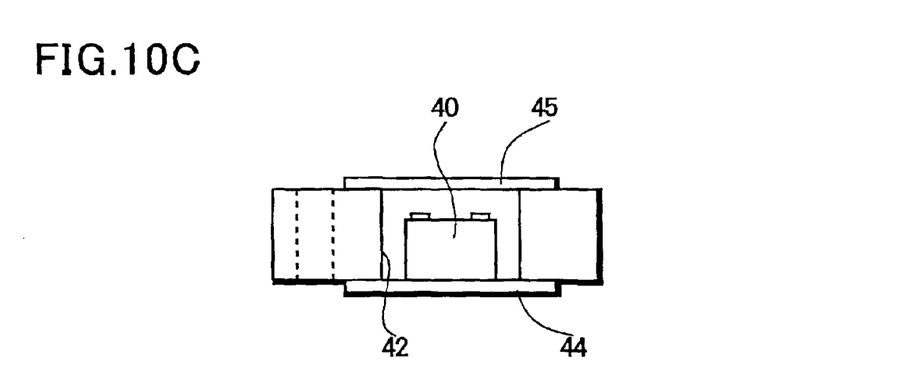
FIG. 10C is a cross-sectional view for explaining the manufacturing method of the invention.

FIG. 10A is a plan view of the carrier tape 41 used for this step, FIG. 10B is a cross-sectional view taken along line AA, and FIG. 10C is a cross-sectional view taken along line BB. The tape 41 is a belt-shaped member having a film thickness of from 0.5 to 1.0 [mm], a width of from 6 to 15 [mm] and a length of several tens of meters, and is made of paper, shaped like corrugated cardboard. Through holes 42 are formed in the tape 41 at predetermined intervals, and feed holes 43 are also formed at a predetermined pitch to feed the tape 41. A die is used to punch the through holes 42 and the feed holes 43 in the tape, and the film thickness of the tape 41 and the size of the through holes 42 are determined in accordance with the sizes of the electronic parts 40 that are to be packed.

A first tape 44 of transparent film is adhered to the reverse surface of the tape 41 to close the bottoms of the through holes 42. And similarly, a second tape 45 of transparent film is adhered to the obverse surface of the tape 41 to close the tops of the through holes 42. The second tape 45 is attached to the tape 41 at adhesive portions 46 near the side edges, while the first tape 44 is attached at corresponding locations along the reverse surface of the tape 41. This adhesive process is performed by thermally bonding the films from above using a member that has heaters positioned at locations corresponding to the adhesion potions 46. After undergoing this adhesive process, the tapes can be peeled apart simply by pulling on the films.

Figure 11A:
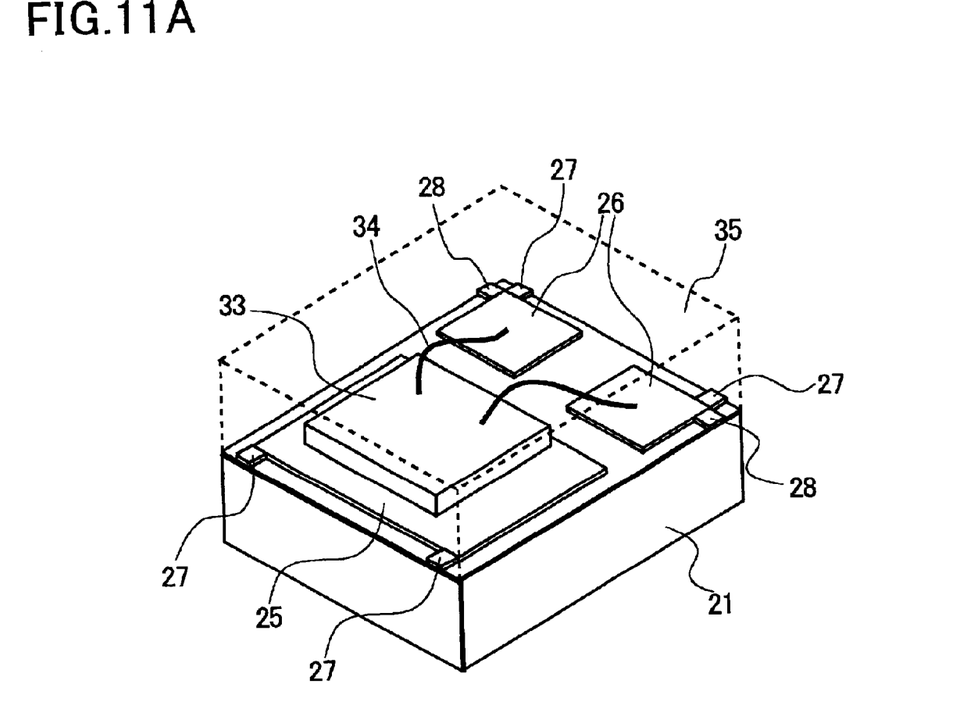
FIG. 11A is a perspective view for explaining the manufacturing method of the invention.
Figure 11B:
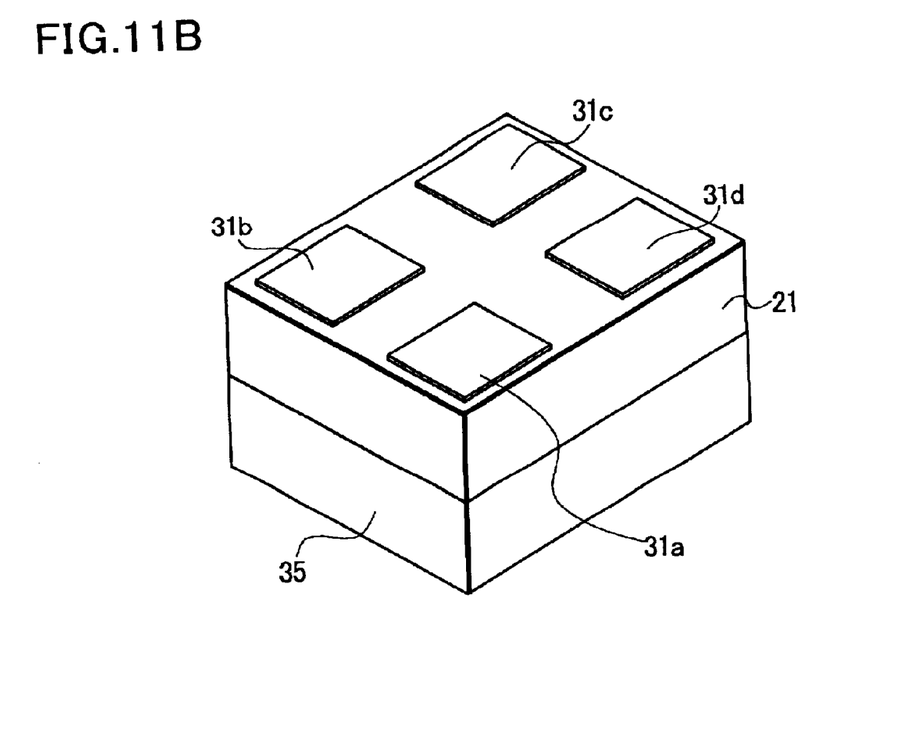
FIG. 11B is a perspective view for explaining the manufacturing method of the invention.

Finally, FIGS. 11A and 11B are perspective views of one semiconductor device package obtained as a result of the above described processing. The four side surfaces of the package are cut surfaces formed when the resin layer 35 and the substrate 21 were cut along the dicing lines 24, the top surface of the package is the flattened surface of the resin layer 35, and the bottom of the package is the reverse surface of the insulating substrate 21.

This semiconductor device has a depth of 1.0 [mm], a width of 0.6 [mm] and a height of 0.5 [mm]. To seal the semiconductor chip 33 which has a thickness of about 150 [$\mu$m], the substrate 21 is covered with the resin layer 35 which has a thickness of about 0.5 [mm]. The island portion 25 and the lead portion 26 are retracted from the end surface of the package, and along the package side surface, only the cut portions of the first and the second connecting portions 27 and 28 are exposed.

The external electrodes 31a to 31d which are about 0.2×0.3 [mm], are arranged at the four corners of the substrate 21 in a pattern horizontally (vertically) symmetrical to the center line of the external package shape. Since this symmetrical arrangement makes the determination of the polarity of the electrode difficult, it is preferable that a polarity mark be provided by forming an indentation in the obverse surface of the resin layer, or by a printed mark.

Since with this manufacturing method semiconductor devices are produced by collectively packaging multiple devices, a reduction can be realized in the resin material that is wasted, compared with when such devices are individually packaged, and expenditures for material can be reduced. Also, since a lead frame is not required, a package can be provided that, when compared with the conventional transfer molding method, has a considerably smaller external size. And in addition, since external connection terminals are formed on the reverse surface of the substrate 21 so that they do not protrude and extend outward from the package, a considerably reduced mounting area is required for the device.

Further, according to the manufacturing method of the invention, for the dicing, the adhesive sheet 50 is glued not to the substrate 21 but to the resin layer 35. If, for example, the adhesive sheet 50 were glued to the substrate 21, when the devices were removed from the adhesive sheet 50, the viscous agent from the adhesive sheet 50 would be attached to the surfaces of the external electrodes 31a to 31d. And if the device were introduced to the automatic mounting apparatus while the viscous agent was attached, soldering of the electrodes 31a to 31d would be deteriorated. Further, a problem due to the attachment of dust to the surfaces of the electrodes 31a to 31d should also be taken into account. However, since the adhesive sheet 50 is attached to the resin layer 35 in this invention, these problems are resolved.

Since the surface of the resin layer 35 is flattened and is horizontal to the substrate 21 before the adhesive sheet 50 is adhered to the resin layer 35, the same vertical and horizontal accuracy can be maintained as is obtained when the adhesive sheet 50 is adhered to the substrate 21.

In this embodiment, four external electrodes are formed while the three-terminal devices are sealed. However, this embodiment can also be applied to a case wherein two semiconductor chips are sealed or an integrated circuit is sealed.

According to the invention, first, multiple substrates are covered with a resin layer, and are adhered to an adhesive sheet, the circumferential edge of which is glued to a metal frame, and in this state, the dicing process and the measurement process can be performed for the substrate. Therefore, a semiconductor device manufacturing method having an extremely high productivity can be implemented, regardless of whether the package structure is tiny.

Second, the semiconductor devices can be stored in the carrier tape, while the multiple substrates are adhered to the adhesive sheet, the circumferential edge of which is attached to the metal frame. Therefore, the semiconductor device can be handled on the substrate base, regardless of the size of the tiny package, and a semiconductor device manufacturing method can be provided for which productivity is extremely high.

Third, according to the manufacturing method, since resin is used for the collective packaging of multiple semiconductor devices, compared with when the devices are individually packaged, there is less resin material waste, and a savings in the expenditures for materials can be realized. Further, since a lead frame is not required, the external size of a package can be considerably reduced, compared with when the conventional transfer molding method is applied. In addition, since the external connection terminals are formed on the reverse surface of the substrate 21, and are not exposed and extend outward from the package, a much smaller mounting area is required for the device. Thus, a product can be provided for which the environment is taken into account.

Fourth, according to the invention, since a lead frame is not employed, a transfer molding apparatus is not required, and accordingly, a separate die is not required for each package shape used by this transfer molding apparatus. And as a result, a resource saving manufacturing line can be provided.

Fifth, since the adhesive sheet fixed to the metal frame is only required when the dicing process, the measurement process and the taping process are performed, as a tool, only the metal frame is required for this manufacturing process, so that the size of a manufacturing line can be reduced, while the dicing to taping processes can be continuously performed by employing only one manufacturing apparatus.

What is claimed is:

1. A method for manufacturing a semiconductor device comprising:

fixing semiconductor chips onto a substrate;

covering the semiconductor chips fixed onto the substrate with a common resin layer;

gluing an adhesive sheet onto the resin layer;

cutting the substrate and the resin layer in a state that the adhesive sheet is glued to the resin layer; and then electrically measuring the semiconductor devices in a state that the adhesive sheet remains substantially uncut and is glued to the resin layer.

2. A method for manufacturing a semiconductor device according to claim 1, wherein the substrate and the resin layer is cut by performing dicing in a state that the adhesive sheet is glued to the resin layer.

3. A method for manufacturing a semiconductor device according to claim 1, wherein external electrodes are provided on the reverse surface of the substrate and electrically connected to the semiconductor chips.

4. A method for manufacturing a semiconductor device according to claim 1, further comprising:

flattening the surface of the resin layer after covering the semiconductor chips with the resin layer.

5. A method for manufacturing a semiconductor device according to claim 1, wherein the circumferential edge of the adhesive sheet is fixed to a metal frame.

6. A method for manufacturing a semiconductor device according to claim 5, wherein a plurality of the substrates are glued to the adhesive sheet.

* * * * *